United States Patent [19]

Inaba et al.

[11] Patent Number: 5,494,524
[45] Date of Patent: Feb. 27, 1996

[54] VERTICAL HEAT TREATMENT DEVICE FOR SEMICONDUCTOR

[75] Inventors: Takeshi Inaba; Eiichi Toya; Takashi Tanaka; Yasumi Sasaki, all of Nishi-Okitama, Japan

[73] Assignee: Toshiba Ceramics Co., Ltd., Tokyo, Japan

[21] Appl. No.: 166,999

[22] Filed: Dec. 16, 1993

[30] Foreign Application Priority Data

Dec. 17, 1992 [JP] Japan .................... 4-337160

[51] Int. Cl.⁶ ............... C23C 16/00; B05C 13/00; B05C 13/02; B05C 21/00
[52] U.S. Cl. ............... 118/728; 118/725; 118/500
[58] Field of Search .............. 118/728, 715, 118/725, 500

[56] References Cited

U.S. PATENT DOCUMENTS 4,781,511  11/1988  Harada et al. ............ 118/500

FOREIGN PATENT DOCUMENTS

0448346A1  3/1991  European Pat. Off. .

OTHER PUBLICATIONS

Ohmine et al., European Patent Application No. 0,448,346 A1, filed on Mar. 19, 1991.
Japanese Utility Model, Laid–Open No. 62–128633, Filed on Feb. 7, 1986.

Primary Examiner—George Fourson
Assistant Examiner—Brian K. Dutton
Attorney, Agent, or Firm—Foley & Lardner

[57] ABSTRACT

End members are located at the top and the bottom of a vertical heat treatment device. A plurality of support members are vertically mounted on the end members. A plurality of wafer hold members are fixed on the support members in a parallel manner, each of which is formed in an approximately circular arc shape. The wafer hold member is made of SiC by a CVD method or Si3N4 by a CVD method. The wafer hold member has a plate portion on which a wafer is to be placed and a reinforce portion connected to the plate portion. The plate portion is 100–1000 microns in thickness.

16 Claims, 5 Drawing Sheets

5,494,524

VERTICAL HEAT TREATMENT DEVICE FOR SEMICONDUCTOR

BACKGROUND OF THE INVENTION

The invention relates to a vertical heat treatment device for semiconductors. A plurality of semiconductor wafers are horizontally placed on the device at intervals in a vertical direction for heat treatment, for instance, forming a silicon oxide film on the surface of each wafer and diffusing impure atoms therein. This device is also called a vertical boat.

This type of vertical heat treatment device for semiconductors is known. Japanese utility Model laid-open No. 62-128633, for example, shows a device as shown in FIGS. 7 and 8.

The conventional vertical heat treatment device shown in FIGS. 7 and 8 comprises two end plates 60 located at the top and the bottom of the device, four support bars 70 vertically mounted on the end plates 60 at intervals, and a plurality of wafer hold members 80 mounted on the support bars 70 at vertical intervals G. The wafer hold member 80 has an approximately half-circular ring shape in plan view and has the same radius of curvature as that of the semiconductor wafer W. The wafer hold member 80 is fixed circumferentially at four spots to the support bars 70 as shown in FIG. 7. An upper portion of the support bars 70 is not shown.

The wafer hold member 80 has a circular arc channel or groove 81 formed inside the top surface thereof, as shown in FIG. 8. The bottom surface of the groove 81 is a wafer placing surface 82 on which the Wafer W is to be placed whereas the side surface of the groove is a wafer engaging surface 83 with which the periphery of the wafer W is to be engaged. The wafer W is transferred by the arm of a transfer robot in the vicinity of the device 50 and placed on the wafer placing surface 82 through the cutout of the wafer hold members 80. The wafer is positioned in such a manner that its circumference is engaged with the wafer engaging surface 83. A wafer place portion 84 including the wafer placing surface 82 has a thickness of T.

The wafer hold member 80 is formed by a silica glass single body, a SiC single body impregnated with Si, a SiC base body impregnated with Si having a CVD-SiC film coated thereon, a carbon base body having a CVD-SiC film coated thereon, or the like.

In said conventional vertical heat treatment device for semiconductors, the wafer place portion 84 of the wafer hold member 80 has a significant thickness T, for instance larger than 1000 microns, for obtaining an enough strength, thereby it has a large heat capacity. Therefore the wafer W held thereon can hardly be heated in the predetermined temperature pattern. As the result, the time required for heat treatments will be increased and characteristics of the wafer surface will be uneven.

As far as each wafer W is concerned, the temperature rises at a more slow pace in the circumferential area engaging with the wafer hold member 80 than in the other areas. Therefore a considerable temperature difference between the two areas is caused, resulting in uneven characteristics of the wafer surface.

SUMMARY OF THE INVENTION

An object of the invention is to provide a vertical heat treatment device for semiconductors wherein the temperature of the wafer held thereon can almost follow the change of the ambient temperature, and the uniformity of temperature distribution on each wafer held thereon can be improved.

According to the invention a vertical heat treatment device for semiconductors is provided, which comprises two end members located at the top and the bottom of the device, a plurality of support members vertically mounted on the end members, and a plurality of wafer hold members mounted on the support members at vertical intervals, each of the wafer hold members being approximately circular arc in plan view, wherein the wafer hold member is made of SiC by a CVD method or Si3N4 by a CVD method, and wherein the wafer hold member comprises a plate portion on which a wafer is to be placed and a reinforce portion connected to the plate portion, the plate portion having a thickness of 100–1000 microns.

In accordance with the invention, the wafer hold member is made of SiC by a CVD method or Si3N4 by a CVD method, it is because both of them have a very high purity, a very large strength, a very large elastic modulus, and a good wear resistance. In addition, both of them have also a dense structure and a small surface roughness. Therefore both the wafer hold member and the semiconductor wafer are hardly damaged or worn down when they engage and slide against each other in operation, and consequently no particles are generated.

The wafer hold members has a "plate" portion on which a wafer is to be placed. Heat is transferred to the "plate" portion from both sides thereof so that its temperature can follow the ambient temperature with ease. The plate portion is from 100 to 1000 microns in thickness. If the thickness is thinner than 100 microns it is in danger of being damaged by the weight of the wafer. Whereas if the thickness is thicker than 1000 microns, its temperature will not quickly follow the ambient temperature, consequently there will be a considerable temperature difference in each wafer between the area engaging with the plate portion and the other area. Thus its thickness is selected properly in the range of 100–1000 microns in accordance with the size of the semiconductor wafer to be heat treated.

The reinforce portion of the wafer hold member is sufficient to be connected to the plate portion in a bending manner so as to define an L-shape with the plate portion. However, the reinforce portion can have a second reinforce portion connected to the L-shaped free edge in such a manner that it defines a U-shape in cross section with the plate portion. The reinforce portion can have also a third reinforce portion connected to the U-shaped free edge so as to generally define a rectangle in cross section with the plate portion.

It is preferable that the wafer hold member comprises a circular arc channel in plan view inside its top surface. The radius of curvature of the channel is the same as the outer diameter of the semiconductor wafer so that the semiconductor wafer is placed and positioned properly in the channel by its periphery.

According to the invention the plate portion has a thickness of 100–1000 microns so that it has a smaller heat capacity than that of the conventional one having the same width. Therefore the temperature following characteristics of the wafer placed on the inventive device is improved, and there is hardly a temperature difference in each wafer between the area engaging with the wafer hold member and the other area, thereby the uniformity of temperature distribution (the heating characteristics) of the wafer is improved.

The wafer place portion has sufficient strength considering its thickness because of the reinforce portion connected thereto. And the wafer support body itself is prevented from being deflected, resulting in good dimensional stability.

DISCLOSURE OF THE EMBODIMENTS OF THE INVENTION

Embodiments of the present invention will be explained with reference to the attached drawings.

Figure 1:
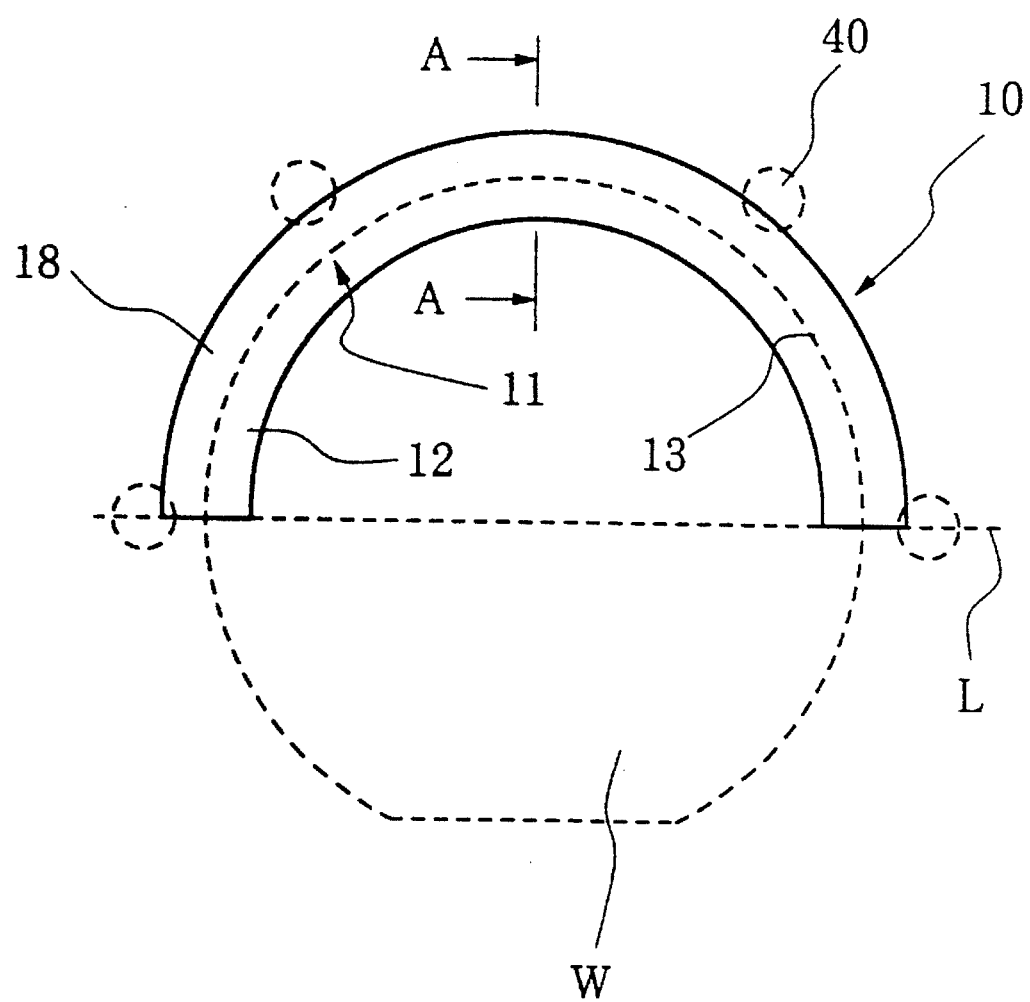
FIG. 1 is a plan view showing a wafer hold member in the first embodiment of the vertical heat treatment device for semiconductors according to the invention.
Figure 2:
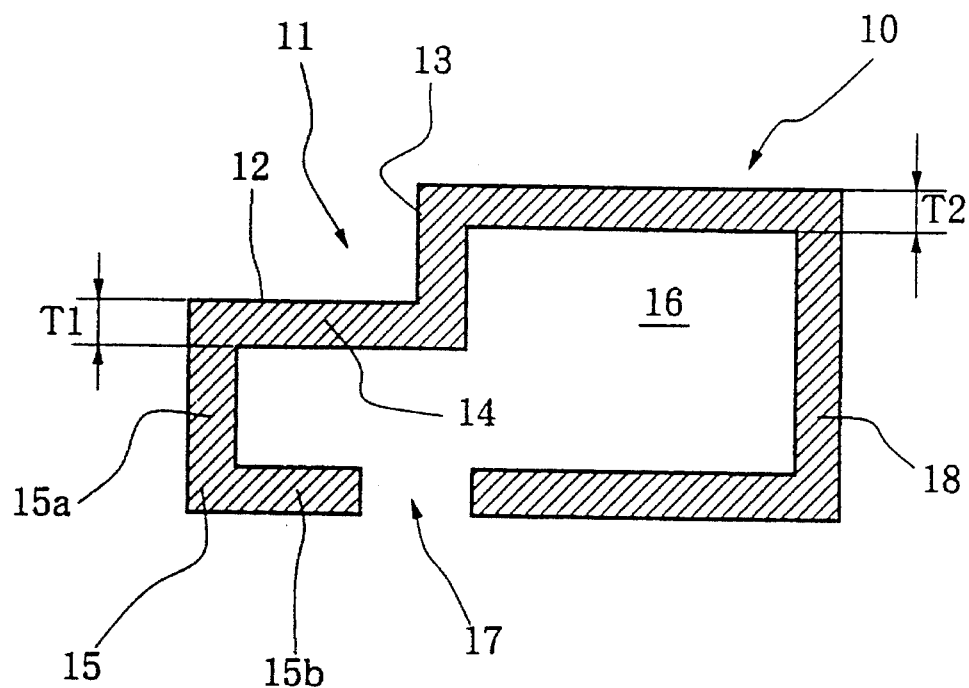
FIG. 2 is a sectional view taken along lines A—A of FIG. 1 showing the wafer hold member in the first embodiment of the vertical heat treatment device for semiconductors.

FIG. 1 is a plan view showing a wafer support body of the vertical heat treatment device for semiconductors in accordance with the first embodiment of the invention, FIG. 2 is a sectional view taken along the lines A—A in FIG. 1.

Figure 7:
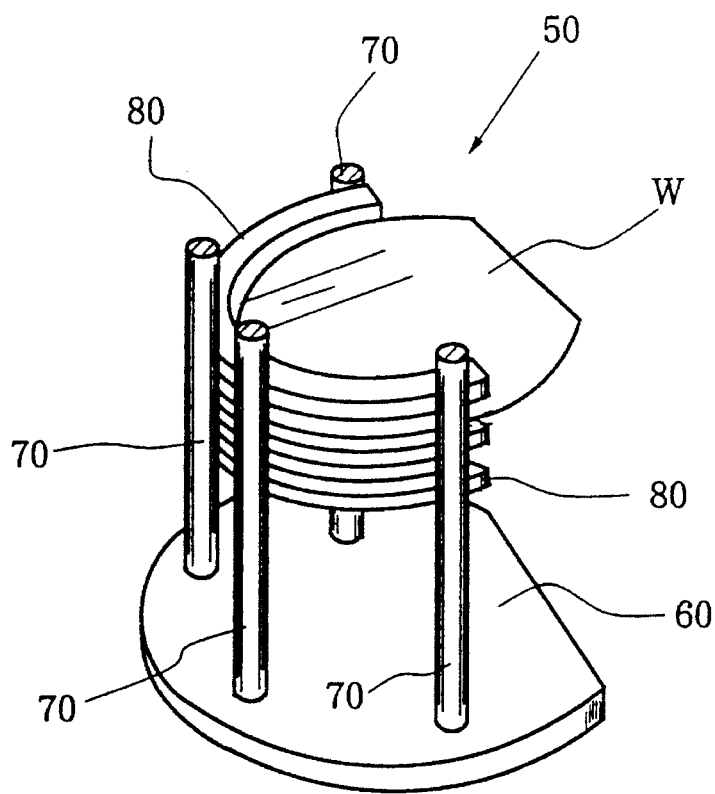
FIG. 7 is a partial perspective view showing a part of a prior art vertical heat treatment device for semiconductors.
Figure 8:
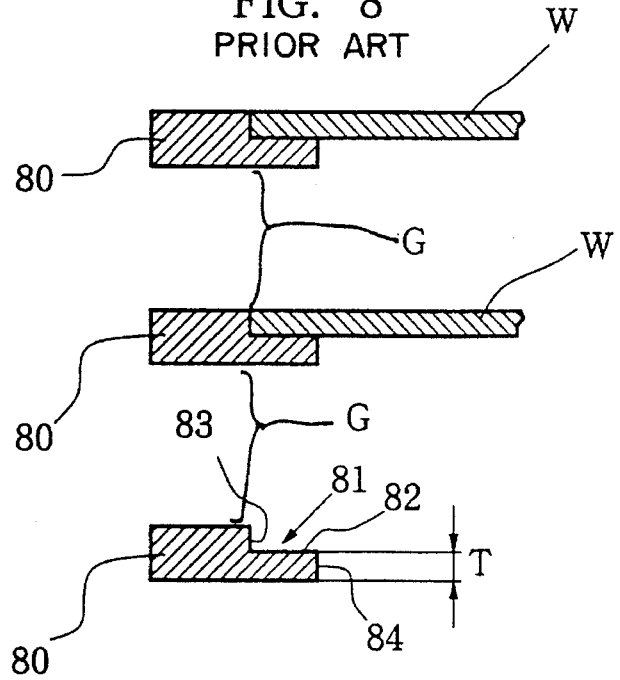
FIG. 8 is a partially enlarged cross sectional view showing the prior art vertical heat treatment device for semiconductors of FIG. 7.

A vertical heat treatment device for semiconductor according to the present invention has generally the same construction as the conventional device 50 shown in FIGS. 7 and 8. The inventive device comprises two end plates (not shown) located at the top and the bottom of the device, four support bars 40 vertically mounted on the end plates, and a plurality of wafer hold members 10 fixed on the support bars 40. The wafer hold members 10 are arranged horizontally at vertical intervals.

The wafer hold member 10 is semi-circular arc in plan view, as shown in FIG. 1. A channel 11 is formed inside the top surface of the wafer hold member 10. The channel 11 is circular arc in plan view, whose radius of curvature is almost the same as the outer diameter of the semiconductor wafer W. The channel 11 has almost the same depth as the thickness of the semiconductor wafer W. The wafer hold member is made of SiC by a CVD method or Si3N4 by a CVD method. As far as the purity is concerned, the wafer hold member is to be made preferably by simplex, however it can be made by complex if only the purity is kept in the desired level.

The wafer hold member 10 is shown in FIG. 2. The channel 11 is like a step in sectional view. The wafer hold member 10 has a plate portion 14 on which a wafer is to be "placed. The wafer hold member 10 has a cavity 16 formed therein. At the bottom of the wafer hold member 10 a passage opening 17 is formed, which extends in a longitudinal direction of the support member so as to be circular arc in bottom view. A circumferential air can be introduced easily through the passage opening 17 into the cavity 16. Therefore the wafer hold member 10 can be heated from outside and inside simultaneously when the heat treatment is operated.

The bottom surface of the channel 11 is to be a wafer placing surface 12 whereas the side surface of the channel 11 is to be a wafer engaging surface 13. The thickness T1 of the plate portion 14 is 100–1000 microns. The thickness T1 is selected within the range of 100–1000 microns according to the size of the semiconductor wafer W.

Other portions except for the plate portion 14 have approximately the same thickness of T2. The thickness T2 is preferably, for instance, more than 200 microns and larger than the thickness T1 by 5% or more relative to the thickness T1. If the thickness T2 is smaller than 200 microns, the wafer hold member 10 will easily be bent by stress. And if the thickness difference is less than 5%, the strength of the wafer hold member is not enough to support the wafer. In other words, the plate portion 14 is thinner by 5% than the other portions of the wafer hold member 10 so that the plate portion 14 is thin enough to have a good thermal response. As the result there is little temperature difference on the wafer and the slips are effectively inhibited.

A reinforce portion 15 is connected to the plate portion 14. The reinforce portion 15 includes a plate 15a extending downwards at a right angle from the inside edge of the plate portion 14, and a plate 15b horizontally and outwardly extending from the lower edge of the plate 15a. Therefore the plate portion 14 and the reinforce portion 15 define a U-shape in sectional view. The wafer hold member 10 has enough strength by means of said U-shaped construction considering the small thickness T1 of the plate portion 14. The wafer hold member 10 will be hardly bent nor deflected by the load of the wafer, and the dimensional accuracy will be generally kept.

Figure 4:
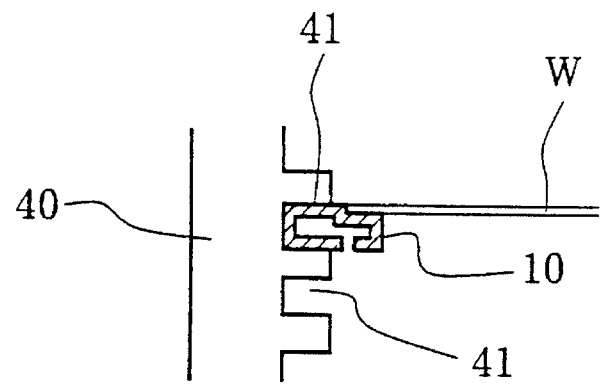
FIGS. 4(a) through 4(c) are partial sectional views showing the condition where wafer hold member is fixed on a support bar according to the invention.
Figure 4:
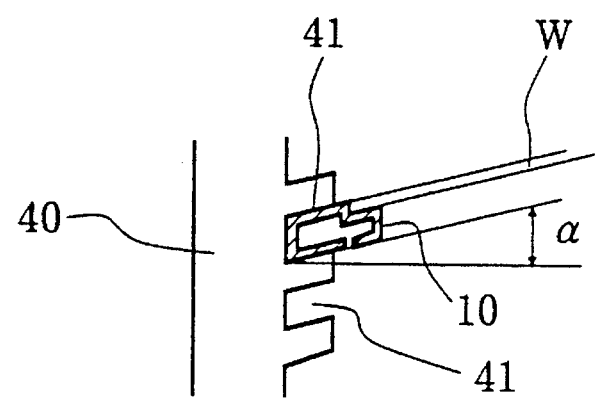
Figure 4:
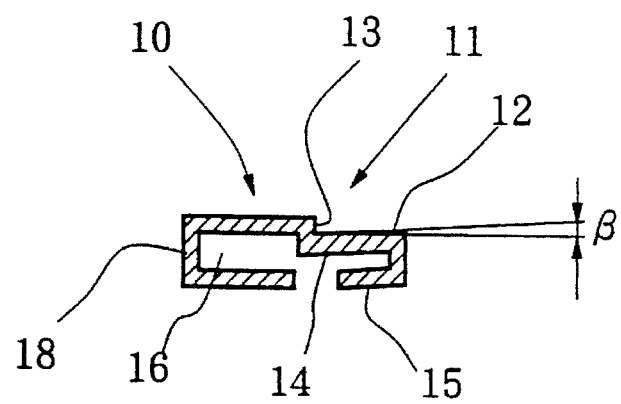

The wafer hold member 10 is horizontally fixed in such a manner that a circumferential fix portion 18 is engaged in the groove 41 formed on the support bar 40, as shown in FIG. 4(a).

Semiconductor wafers W are placed on said heat treatment device in the following manner. First the semiconductor wafer W is transferred to nearby the device by the arm of a transfer robot, then the arm is moved further toward the wafer hold member 10 so as to place the wafer W on the wafer place surface 12. The wafer W is positioned with the aid of the wafer engaging surface 13, and is held by the wafer hold member 10 as shown in FIG. 1.

Figure 3:
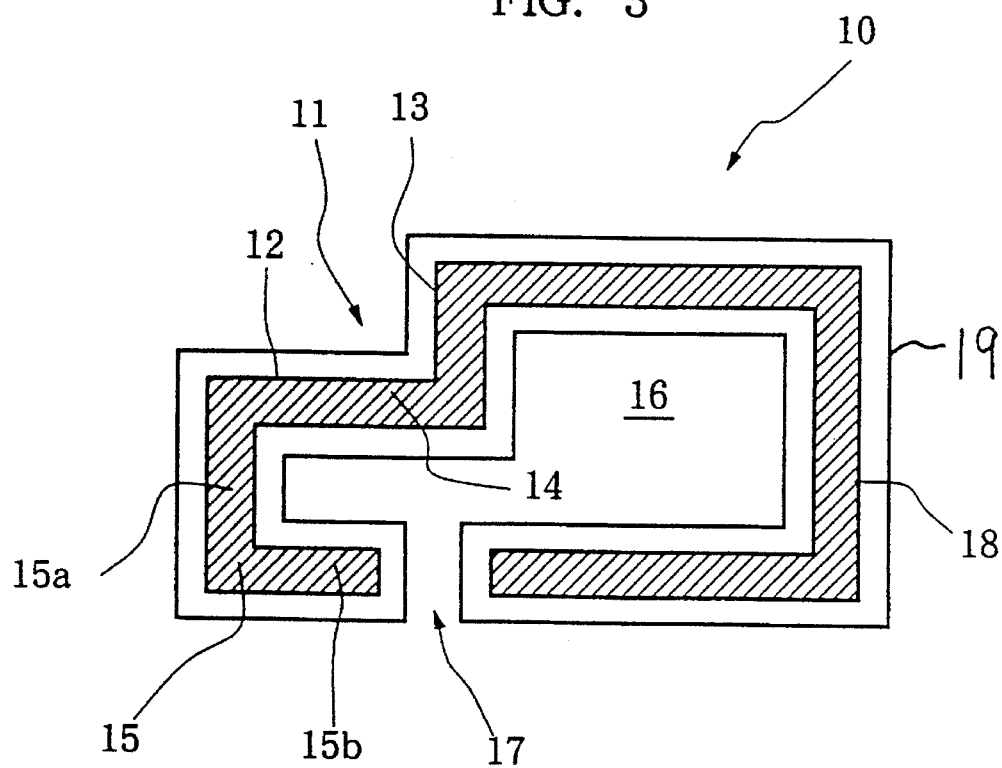
FIG. 3 is a sectional view showing the wafer hold member in the second embodiment of the vertical heat treatment device for semiconductors.

FIG. 3 is a sectional view showing a second embodiment of the vertical heat treatment device for semiconductors according to the invention.

The wafer hold member 10 of the second embodiment has a film 19 coated on the surface of the wafer hold member 10 of the first embodiment. The film 19 is made of the same material as the wafer hold member 10, or SiC by a CVD method or Si3N4 by a CVD method. The inside surface of the wafer hold member 10, which is a carbon removing surface (later-described) and from which particles may generate, is coated by a CVD-SiC film or a CVD-Si3N4 film 19, therefore the number of particles will be decreased very much.

Figure 5:
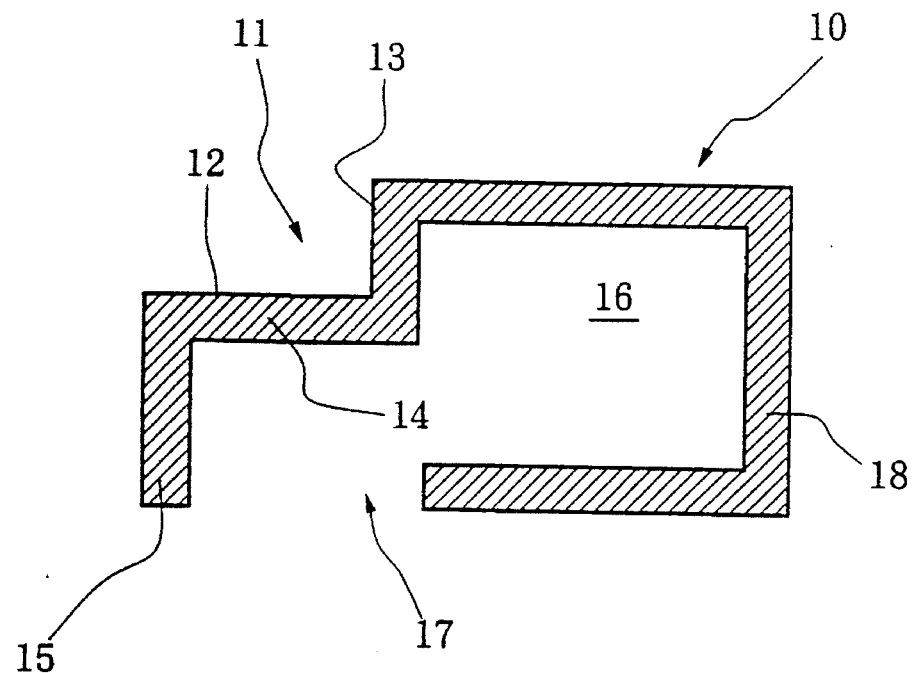
FIG. 5 is a sectional view showing the wafer hold member in the third embodiment of the vertical heat treatment device for semiconductors.

FIG. 5 is a sectional view showing a third embodiment of the vertical heat treatment device for semiconductor according to the invention.

The wafer hold member 10 of the third embodiment has a modified reinforce portion 15 as compared to that of the first embodiment. In the third embodiment the reinforce portion 15 is formed by only the single plate 15a extending downwards.

Figure 6:
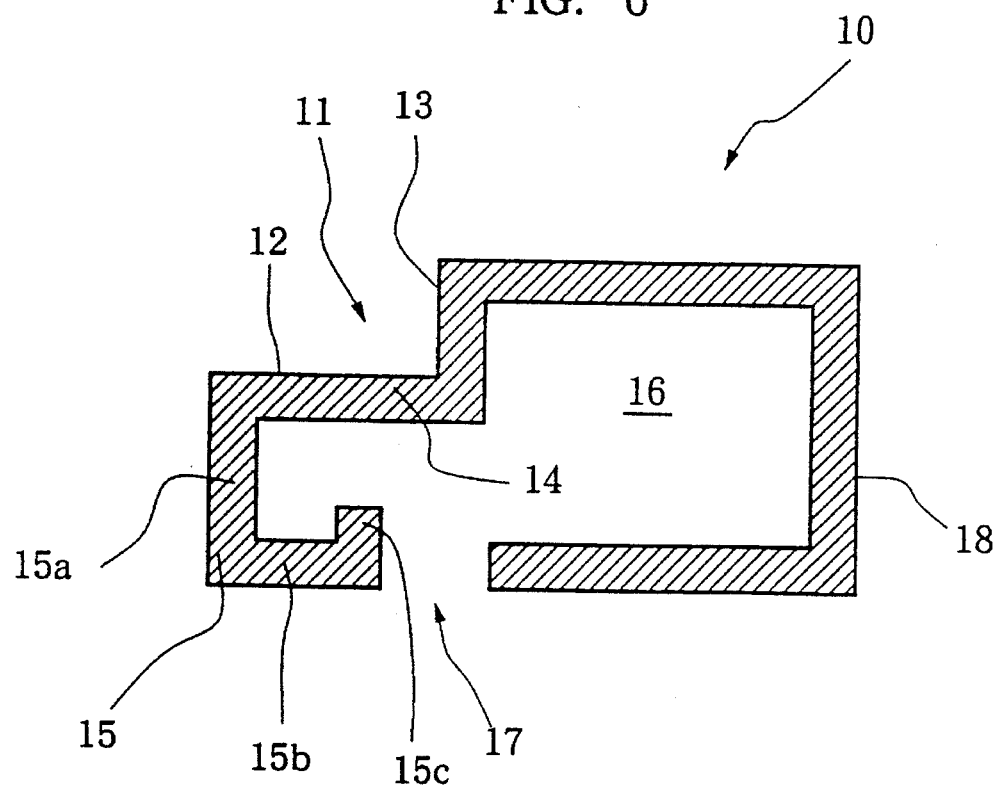
FIG. 6 is a sectional view showing the wafer hold member in the fourth embodiment of the vertical heat treatment device of semiconductors.

FIG. 6 is a sectional view showing a fourth embodiment of the vertical heat treatment device for semiconductors according to the invention.

The wafer hold member 10 of the fourth embodiment has a modified reinforce portion 15 as compared to that of the first embodiment. In the fourth embodiment the reinforce portion has a further plate 15c extending upwards from the outer edge of the plate 15b. Thus, the reinforce portion 15 can be variously modified.

In each of the above-stated embodiments the wafer hold members 10 are fixed horizontally on the support bars 40, however the wafer hold member 10 can be fixed in a somewhat inclined manner, for example, by alpha degrees as shown in FIG. 4(b). In this case the wafer hold member 10 is so arranged that the wafer inserting side is positioned upwards. Therefore the wafer supported by the wafer hold member will not fall down.

The wafer placing surface 12 itself or the wafer place portion 14 itself can be formed in a somewhat inclined manner, for example, by beta degrees as shown in FIG. 4(c). In this case the wafer hold member 10 can be horizontally fixed.

The wafer support members of the vertical heat treatment device for semiconductors according to the invention can be produced in the following steps.

In accordance with the usual method for making SiC (or Si3N4) simplex by a CVD method, a carbon base material is formed in the predetermined shaped body, a CVD-SiC film is coated on the carbon body, and then the carbon body is oxidized to be removed.

However, in this method carbon ash particles are apt to be adhered on the surface of the SiC simplex which was engaged with the carbon base. Such particles cannot be removed by ultrasonic cleaning, acid cleaning and so on. Then said particles on the surface engaging with the carbon are removed by polishing. Instead of polishing, a SiC (or Si3N4) film by CVD method can be formed on the simplex body as described in the second embodiment. By this double CVD treatment the number of generating particles can be decreased to approximately 1/10.

In another method, carbon base material is formed in a predetermined shaped body, a Si layer is formed on the carbon body by vapor deposition, a SiC layer is formed on the Si layer by vapor deposition, the carbon body is oxidized to be removed, and then the Si layer is removed by etching so as to obtain a support member made of the SiC layer. This method has an advantage that particles generated in the step of oxidation for removing carbon base material can be removed effectively.

The result of a comparative test between examples of the present invention and comparative examples will be described.

Examples A–G were the wafer hold members formed by a CVD-SiC simplex. The examples A–G had almost the same construction as the wafer hold member 10 of the first embodiment. The thicknesses of the plate portions 14 of each of examples A–G were modified according to the following table. The thickness of the other portions except for the plate portion 14 was 1500 microns in all examples.

Semiconductor wafers W were set on each of the examples A–G and were heated from room temperature to 1200 degree Celsius according to a heat pattern program. Then the temperature at two points, the central point and the peripheral point (engaging with the wafer hold member) on the semiconductor wafer W, were detected by a thermocouple and the temperature difference was counted.

After being heated up to 1200 degrees Celsius, the time lag until said temperature difference became equal to or less than 2 degrees was detected in each case. The results are described in following table.

| example | thickness | temperature difference(degrees) | time(min.) |
| --- | --- | --- | --- |
| A | 1500 | 28 | 18 |
| B | 1200 | 24 | 16 |
| C | 1000 | 10 | 7 |
| D | 700 | 9 | 5 |
| E | 400 | 7 | 3 |
| F | 100 | 5 | 3 |
| G | 50 | — | — |

In the case of the example G, the wafer hold member was broken during heating so that its data is not shown.

As the above results show, in case the plate portion had a thickness of 100–1000 microns, good results were obtained.

Next, two examples of wafer hold members were made, one of which had the same construction as said first embodiment and the other had the same construction as said second embodiment. The former had no additional CVD-films while the latter had an additional CVD-SiC film. The number of generated particles was detected in each cases for comparison. The results were as follows.

| diameters of particles (microns) | without CVD-SiC films (numbers) | with CVD-SiC film (numbers) |
| --- | --- | --- |
| 0.24–10.0 | 41 | 2 |
| 0.20–0.23 | 52 | 3 |
| 0.16–0.19 | 95 | 10 |
| 0.11–0.15 | 168 | 15 |

As the above results show, the number of generated particles was decreased by about 1/10 by means of a CVD-SiC film.

According to the present invention, the temperature of the wafers held on the device almost follows the ambient temperature, and the uniformity of temperature distribution on each wafer can be improved.

The invention is not restricted to the described embodiments, for instance, the shape or the location of the wafer hold member can be modified.

What is claimed is:

1. A vertical heat treatment device for semiconductors, comprising:

a plurality of wafer hold members for holding semiconductor wafers; and means for supporting the wafer hold members at intervals;

each of the wafer hold members having an enclosure formed therein in which a cavity is formed, wherein the cavity is formed by removing a carbon body from one of a SiC and Si3N4 coating enclosing the carbon body.

2. The vertical heat treatment r device as claimed in claim 1, wherein each of the wafer hold members is made of one of SiC and Si3N4 by a CVD method.

3. A vertical heat treatment device for semiconductors, comprising:

a plurality of support members; and a plurality of wafer hold members supported by the support members, each of the wafer hold members having an enclosure formed therein, wherein the enclosure has a passage opening at a bottom portion of said each of the wafer hold members.

4. The vertical heat treatment device as claimed in claim 3, wherein the wafer hold members are made of one of SiC and Si3N4 by a CVD method.

5. The vertical heat treatment device wherein said each of the wafer hold members includes a longitudinal passage opening formed in an underside thereof.

6. The vertical heat treatment device as claimed in claim 3, wherein the wafer hold members have an approximately semicircular arc shape.

7. The vertical heat treatment device as claimed in claim 3, wherein the wafer hold members have one of a CVD-SiC film and a CVD-Si3N4 film formed on a surface thereof.

8. The vertical heat treatment device as claimed in claim 3, wherein the wafer hold members have a channel formed inside a top surface thereof, a radius of curvature of the channel being substantially the same as that of a semiconductor wafer to be treated, a depth of the channel being substantially equal to a thickness of the semiconductor wafer.

9. The vertical heat treatment device as claimed in claim 3, wherein the wafer hold members are mounted on the support members in such a manner that they are inclined relative to a horizontal plane.

10. The vertical heat treatment device as claimed in claim 3, wherein said each of the wafer hold members comprise a plate portion on which a wafer is to be placed and a reinforce portion connected to the plate portion, the plate portion having a thickness of 100–1000 microns.

11. The vertical heat treatment device as claimed in claim 10, wherein the reinforce portion comprises at least one plate.

12. The vertical heat treatment device as claimed in claim 10, wherein the plate portion and the reinforce portion define an L-shape in cross-section.

13. The vertical heat treatment device as claimed in claim 10, wherein the plate portion and the reinforce portion define a U-shape in cross-section.

14. The vertical heat treatment device as claimed in claim 10, wherein the plate portion and other portions of the wafer hold members have substantially the same thickness.

15. The vertical heat treatment device as claimed in claim 10, wherein a difference between the thickness of the plate portion and a thickness of other portions is 5% or more, and the thickness of the other portions is 200 microns or more.

16. The vertical heat treatment device as claimed in claim 10, wherein the plate portion is formed so as to be inclined relative to other portions of the wafer hold members.

* * * * *